United States Patent [19]

Heise

[11] 3,711,784

[45] Jan. 16, 1973

[54] CIRCUIT ARRANGEMENT FOR CONNECTING A PLURALITY OF FREQUENCY MULTIPLIER STAGES TO A COMMON FUNDAMENTAL FREQUENCY GENERATOR

[75] Inventor: Rudolf Heise, Wolfratshausen, Germany

[73] Assignee: Siemens Aktiengesellschaft, Berlin and Munich, Germany

[22] Filed: Sept. 21, 1971

[21] Appl. No.: 182,326

[30] Foreign Application Priority Data

Sept. 24, 1970 Germany....................P 20 47 145.8

[52] U.S. Cl. ..........................331/53, 321/69, 331/49

[51] Int. Cl. ..............................................H03b 19/14

[58] Field of Search..................331/53, 49; 321/69 R

[56] References Cited

UNITED STATES PATENTS 3,533,019 10/1970 Knirsch.................................331/49

*Primary Examiner*—John Kominski
*Attorney*—Arthur E. Wilfond et al.

[57] ABSTRACT

A circuit arrangement connects a plurality of frequency multiplier stages, each producing a different output frequency, and only one of which operates at a specific time, to a common fundamental frequency generator. Each of a plurality of switching diodes couples the input of a corresponding one of the frequency multiplier stages to the fundamental frequency generator. Each of a plurality of bandpass filters is tuned to a different corresponding harmonic and each couples the output of corresponding one of the frequency multiplier stages to a common output terminal. A current supply is connected to the switching diodes for supplying current to the fundamental frequency generator via the switching diode of the operating frequency multiplier stage.

9 Claims, 5 Drawing Figures

CIRCUIT ARRANGEMENT FOR CONNECTING A PLURALITY OF FREQUENCY MULTIPLIER STAGES TO A COMMON FUNDAMENTAL FREQUENCY GENERATOR

The invention relates to a circuit arrangement for connecting a plurality of frequency multiplier stages to a common fundamental frequency generator. More particularly, the invention relates to a circuit arrangement for connecting a plurality of frequency multiplier stages, each producing a different output frequency, and only one of which operates at a specific time, to a common fundamental frequency generator.

In the generation of transmitter and receiver oscillator frequencies for wide frequency bands and for frequencies which may be switched in steps, it is desirable to utilize frequency multipliers of simple structure such as, for example, including semiconductor multiplier diodes. It is, of course, possible to utilize different generators for the fundamental frequencies. A simpler method, however, is to connect a plurality of multiplier stages having different multiplication factors to a common fundamental frequency generator. The multiplication factors of the multiplier stages are provided in accordance with the desired output frequencies.

An object of the invention is to provide a circuit arrangement for connecting a plurality of frequency multiplier stages to a common fundamental frequency generator of simple structure and simple operation but which satisfies strict requirements regarding spurious waves and undesired frequencies.

An object of the invention is to provide a circuit arrangement for connecting a plurality of frequency multiplier stages to a common fundamental frequency generator, which circuit arrangement functions with efficiency, effectiveness and reliability.

An object of the invention is to provide a circuit arrangement for connecting a plurality of frequency multiplier stages to a common fundamental frequency generator, which circuit arrangement provides a great number of frequencies in, for example, decade steps, from a single fundamental frequency. This is accomplished by the stepwise connection of one frequency multiplier of higher output frequency and time.

Still another object of the invention is to provide a circuit arrangement for connecting a plurality of frequency multiplier stages to a common fundamental frequency generator, which circuit arrangement largely suppresses spurious waves originating in the cut off frequency multiplier stages.

In accordance with the invention, a circuit arrangement for connecting a plurality of frequency multiplier stages, each producing a different output frequency, and only one of which operates at a specific time, to a common fundamental frequency generator, each of the frequency multiplier stages having an input and an output, comprises a plurality of switching diodes each coupling the input of a corresponding one of the frequency multiplier stages to the fundamental frequency generator. Each of a plurality of bandpass filters is tuned to a different corresponding harmonic and each couples the output of a corresponding one of the frequency multiplier stages to a common output terminal. Current supply means connected to the switching diodes supplies current to the fundamental frequency generator via the switching diode of the operating frequency multiplier stage.

Voltage cutoff means connected to each of the frequency multiplier stages cuts off all the frequency multiplier stages but the operating one simultaneously with the operation of the one of the frequency multiplier stages.

Each of the frequency multiplier stages has a step recovery semiconductor multiplier diode and bias means connected to the multiplier diode for shifting the bias of the multiplier diode of each of the frequency multiplier stages to be cut off from a normal operating bias to a high reverse bias.

Each of the frequency multiplier stages has a step recovery semiconductor multiplier diode and bias means connected to the multiplier diode for biasing the diode of each of the frequency multiplier stages to be cut off in the conductive direction.

Cutoff voltage means has a plurality of resistors each connected to a corresponding one of the frequency multiplier stages for applying a cutoff voltage to the corresponding frequency multiplier stage and a plurality of short-circuit means each connected to a corresponding one of the resistors for short-circuiting the resistor of the frequency multiplier stage to be operated. Each of the switching diodes is coupled in series between the common fundamental frequency generator and a corresponding one of the frequency multiplier stages so that the cutoff voltage applied to each of the frequency multiplier stages to be cut off by the cutoff voltage means simultaneously blocks the corresponding switching diode.

The cutoff voltage means comprises a plurality of common resistors each connected to a corresponding one of the switching diodes for applying the cutoff voltage to the frequency multiplier stages. Each of a plurality of RF chokes is connected between a corresponding one of the common resistors and a corresponding one of the switching diodes for applying the cutoff voltage to the switching diodes. Each of a plurality of load resistors is coupled between a corresponding one of the common resistors and the multiplier diode of a corresponding one of the frequency multiplier stages for codetermining the bias applied to each of the multiplier diodes. The voltage at a common point in the connection between the common resistor and the load resistor of a frequency multiplier stage to be operated is short-circuited.

The cutoff voltage means comprises a plurality of common resistors each for applying the cutoff voltage to a corresponding one of the frequency multiplier stages. Each of a plurality of RF chokes is connected to a corresponding one of the switching diodes for applying the cutoff voltage to the switching diodes. Each of a plurality of transistor buffer stages is connected between a corresponding one of the RF chokes and a corresponding one of the common resistors. Each of a plurality of separate load resistors is coupled to the multiplier diode of a corresponding one of the frequency multiplier stages for codetermining the bias applied to each of the multiplier diodes and is connected in DC shunt with a corresponding one of the transistor buffer stages. Each of the transistor buffer stages has an emitter side connected to the corresponding common resistor and presents a high resistance circuit relative to the load resistor when the corresponding frequency multiplier stage is cut off and supplies a conduction current of sufficient magnitude for the multiplier diode when the corresponding frequency multiplier stage is operated.

Each of a plurality of harmonic traps is connected to a corresponding one of the switching diodes. Each of the harmonic traps is for the harmonic to which the corresponding frequency multiplier stage is tuned.

In order that the invention may be readily carried into effect, it will now be described with reference to the accompanying drawings, wherein.

In the FIGS., the same components are identified by the same reference numerals.

Figure 1:
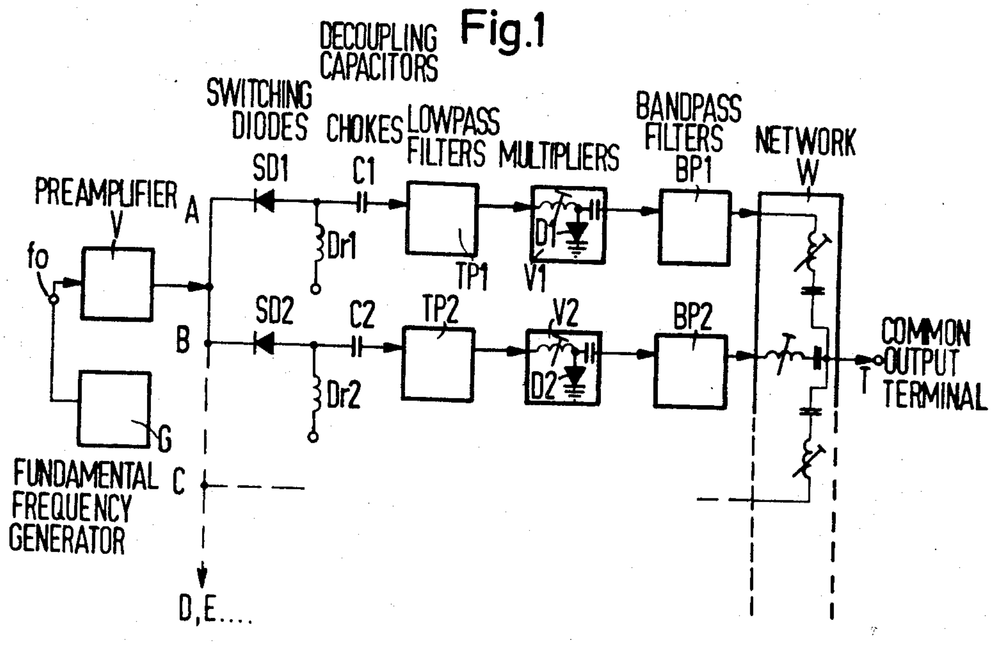
FIG. 1 is a block diagram of an embodiment of the circuit arrangement of the invention for connecting a plurality of frequency multiplier stages to a common fundamental frequency generator.

In FIG. 1, a fundamental frequency generator G produces a fundamental wave frequency *fo*. The fundamental wave frequency *fo* is supplied from the fundamental frequency generator to the input of a preamplifier V. The output of the preamplifier V is connected in common to a plurality of switching diodes SD1, SD2, and so on, which are connected in parallel to said preamplifier. Each of a plurality of frequency multiplier stages A, B, C, D, E, and so on, is connected at its input to a corresponding one of the switching diodes SD1, SD2, and so on. In order to maintain the clarity of illustration, only two of the frequency multiplier stages are shown in the FIGS. The two illustrated frequency multiplier stages are A and B. The broken lines indicate that a plurality of additional frequency multiplier stages may be connected in parallel to those illustrated in the FIG.

Each of the illustrated frequency multiplier branches A and B comprises a decoupling capacitor C1 in the branch A and C2 in the branch B. The capacitor C1 connects the anode of the switching diode SD1 to the input of a lowpass filter TP1 and the capacitor C2 connects the anode of the switching diode SD2 to the input of a lowpass filter TP2. The lowpass filters TP1 and TP2 are for the fundamental frequency fo. The input of a frequency multiplier V1 is connected to the output of the lowpass filter TP1 in the frequency multiplier stage or branch A. The input of a frequency multiplier V2 is connected to the output of the low-pass filter TP2 in the frequency multiplier state or branch B. Each of the frequency multipliers V1 and V2 comprises a semiconductor multiplier diode. Thus, the frequency multiplier V1 has a multiplier diode D1 and the frequency multiplier V2 has a multiplier diode D2.

The output of the frequency multiplier V1 is connected to the input of a bandpass filter BP1 in the frequency multiplier stage A. The output of the frequency multiplier V2 is connected to the input of a bandpass filter BP2 in the frequency multiplier stage B. Each of the bandpass filters BP1 and BP2 is tuned to a desired harmonic which is to be produced by the frequency multiplier stage in which it is connected. The outputs of the bandpass filters BP1 and BP2 are connected to a common output terminal T via a network W. The common output terminal T thus provides any generated multiple of the fundamental frequency f*o*.

Figure 2:
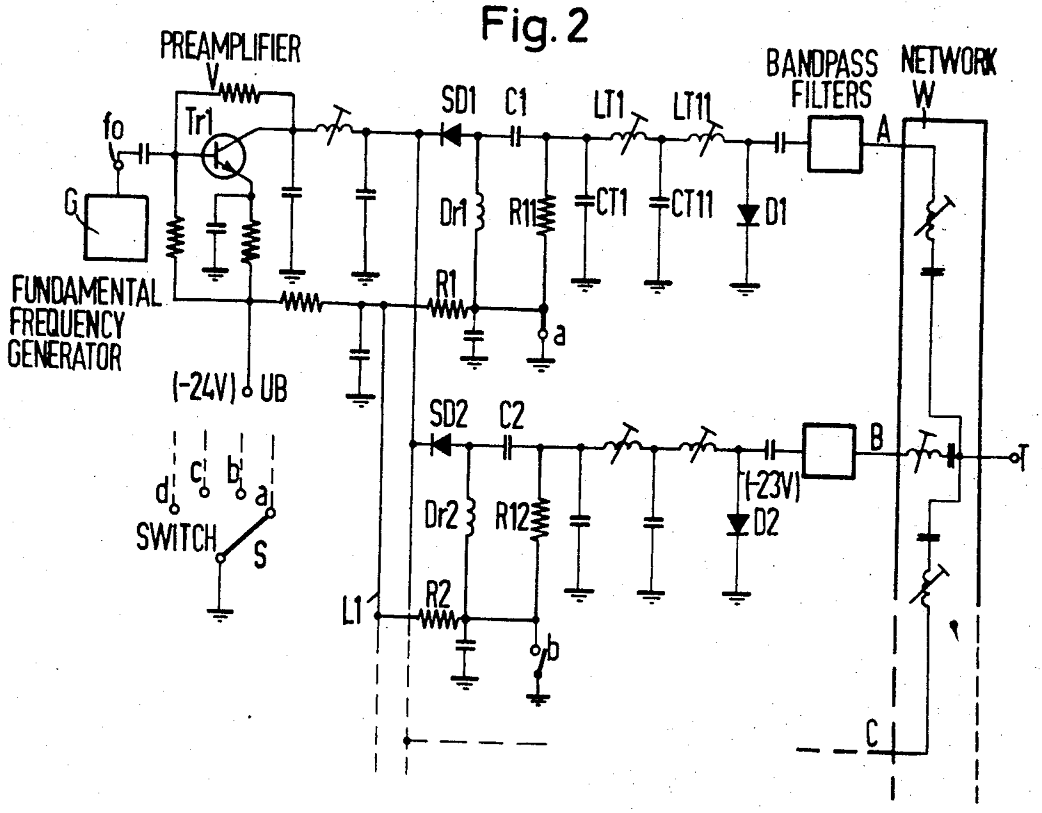
FIG. 2 is a circuit diagram of an embodiment of part of the circuit anrangement of FIG. 1.

The network W comprises bandpass filters of conventional construction, in the simplest case series resonant circuits which are tuned to the output frequencies of the multiplier stages, for example, A, B, C in FIG. 2. The outputs of the bandpass filters are led to the common output terminal.

An RF choke D*r*1 is connected between a common point in the connection between the switching diode SD1 and the decoupling capacitor C1 and a point at ground potential. An RF choke D*r*2 is connected between a common point in the connection between the switching diode SD2 and the decoupling capacitor C2 and a point at ground potential. The RF chokes D*r*l and D*r*2 apply the DC voltage to the switching diodes SD1 and SD2.

As may be seen in FIG. 2, one of the switching diodes SD1 and SD2 is always fired or in its conductive condition and simultaneously supplies the supply current for the preamplifier V and/or the fundamental frequency generator G. The otherwise required diode switching current is thereby not dissipated in an additional resistor, but functions to supply the fundamental frequency network.

In FIG. 2, the preamplifier V is a transistor stage. A supply voltage UV is applied to the emitter electrode of the transistor T*r*1 of the preamplifier V. The supply voltage UV is −24 volts. A negative voltage, which is the cutoff voltage, having a magnitude approximately equal to that of the supply voltage UV, functions to cut off the individual frequency multiplier stages and is normally applied via a line L1 to the switching diodes SD1 and SD2 via corresponding common resistors R1 or R2 and the corresponding RF chokes D*r*l or D*r*2. A voltage is applied to the corresponding switching diodes SD1 or SD2 only if the corresponding circuit point *a* or *b* of the frequency multiplier stages A and B, respectively, is connected to a point at ground or zero potential by a switch S. The switch S is illustrated separately at the left of FIG. 2.

When a voltage is applied to the switching diode SD1, for example, by the closing of the switch S between the circuit point *a* and a point at ground potential, said switching diode is switched to its conductive condition. When the switching diode SD1 is in its conductive condition, it simultaneously supplies the supply current to the transistor T*r*1 of the preamplifier V via a decoupling network. Since the voltage drop across the switching diodes SD1 and SD2 is negligibly small, all the other frequency multiplier stages, which are B, C, D, E, and so on, in this example, are at DC ground potential at their corresponding switching diodes at the junction point of the cathodes of said switching diodes. The cutoff voltage on the line L1 thus cuts off the switching diodes SD2, and so on, of all the frequency multiplier stages other than the operating frequency multiplier stage A, in the present example.

In order to provide better decoupling between the individual frequency multiplier stages A, B, C, and so on, it is, however, advisable to also apply to the multiplier diodes D1, D2, and so on, a voltage which switches them either to their fully conductive or fully non-conductive condition if the corresponding frequency multiplier stage is to be cut off or inoperative.

FIG. 2 illustrates the case in which the multiplier diode is biased to an operating point considerably greater than the reverse voltage which normally prevails in its operating condition due to selfrectification. This is accomplished by a load resistor R11 connected in the frequency multiplier stage A and a load resistor R12 connected in the frequency multiplier stage B. The load resistor R11 is connected to a common point in the connection of the choke D*r*1 and the common resistor R1. The load resistor R12 is connected to a common point in the connection of the choke D*r*2 and the common resistor R2.

In the present example, the frequency multiplier branch A is operative and the other frequency multiplier branches B, C, and so on, are cut off or inoperative. Therefore, the common point in the connection of the choke D*r*1 and the common resistor R1 is connected to a point at ground potential. An automatic bias of the multiplier diode D1 may thus build up at the decoupling capacitor C1 and at the lowpass filter TP1, which comprises variable inductors LT1 and LT11 and capacitors CT1 and CT11, which pass DC current. In the present example, the bias voltage is approximately −14 volts. In the cutoff condition of the frequency multiplier stages B, C, and so on, on the other hand, the high cutoff voltage on the line L1, which is approximately −24 volts, is applied to the multiplier diodes of said frequency multiplier stages in the reverse direction via the load resistors R12, and so on. This provides the advantage that the corresponding circuits are detuned due to the smaller capacitance of the corresponding multiplier diodes.

The foregoing operation provides an additional improvement with regard to spurious frequencies. The spurious frequencies would otherwise be produced. Since in all diodes, all possible types of harmonics are produced even in the reverse condition, due to the residual capacitance of the switching diodes, the operative frequency multiplier stage could supply such harmonics to all the other frequency multiplier stages which are tuned to such harmonics, via the common supply line. Thus, many frequency multiplier stages, especially those which are close in frequency to the operative frequency multiplier stage, could supply interfering spurious waves at the fundamental frequency or at multiples thereof.

RF residues of the fundamental wave which reach the cutoff frequency multiplier stages could further generate harmonics in said frequency multiplier stages, which harmonics are the same as those in the operative frequency multiplier stage. This would result in the production of a type of phase noise at the desired operating frequency, since the harmonics reach the outputs of the frequency multiplier stages with other phases and amplitudes. The aforedescribed circuit arrangement of FIG. 2 provides a decoupling of approximately 70 dB for the spurious waves between the individual frequency multiplier stages. The circuit detuning of the cutoff frequency multiplier stages, which in the present example is approximately 2.5 percent, is important for the decoupling.

If, for example, the frequency multiplier stage A is operative and produces from a fundamental frequency fo equal to 50 megahertz, 750 megahertz, which is the fifteenth harmonic, it also produces a frequency of 650 megahertz, which is the 13th harmonic, at the operating diode. The 650 megahertz harmonic frequency could, for example, reach the frequency multiplier branch B via the reverse path, since the desired output frequency of said frequency multiplier branch is 650 megahertz. The multiplier diode D2 of the frequency multiplier branch B detunes the respective circuits, however, due to the high reverse voltage thereof, so that said circuits are shifted to 670 megahertz in the present example. Therefore, the attenuation of this spurious wave, which is already great due to the operation of the lowpass filter TP1 of the frequency multiplier stage A, may be increased to approximately 70 dB.

Figure 3:
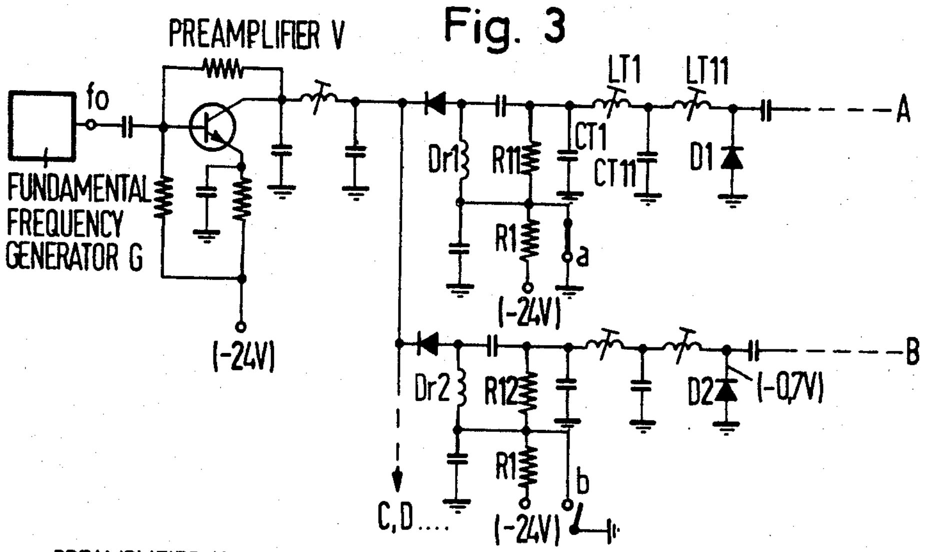
FIG. 3 is a circuit diagram of another embodiment of part of the circuit arrangement of FIG. 1.
Figures 4, 5:
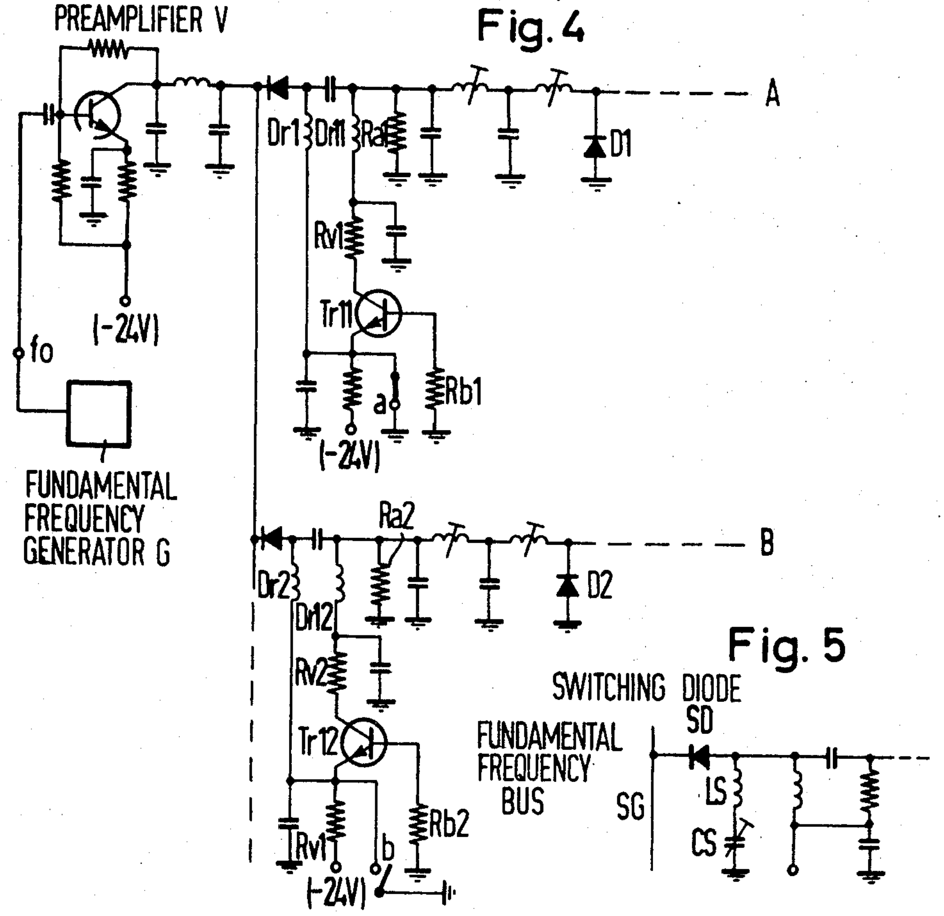
FIG. 4 is a circuit diagram of still another embodiment of part of the circuit arrangement of FIG. 1.
FIG. 5 is a circuit diagram of a harmonic trap which may be connected in the circuit arrangement of FIG. 1.

Additional improvements regarding the decoupling may be provided by the embodiments of FIGS. 3, 4 and 5. In FIG. 3, the multiplier diodes D1 and D2 are connected in a manner whereby the cutoff voltage at the circuit points *a* and *b* switches such diodes to their conductive condition when the corresponding multipliers are in their inoperative condition. All the other circuitry of the embodiment of FIG. 3 is the same as that of the embodiment of FIG. 2, so that the circuit components are not labeled in FIG. 3.

In a circuit of the type of the embodiment of FIG. 3, the load resistors R11 and R12 should, on the one hand, have a low resistance in order to impress upon the corresponding multiplier diode a current having as large a magnitude as possible in the conducting direction. On the other hand, however, the load resistors R11 and R12 simultaneously function as the load resistors for the automatic bias. It is therefore sometimes necessary to provide an unfavorable compromise. The load resistors for the provision of the automatic bias should by themselves have a high resistance value in many cases. The embodiment of FIG. 4 avoids an unfavorable compromise, since in said embodiment, the load resistors R*a*1, R*a*2, and so on, are provided separately and are connected directly to a point at ground potential.

The circuit of the resistors R11 and R12 of the embodiment of FIG. 3 is replaced in the embodiment of FIG. 4 by a transistor buffer stage. The transistor buffer stage of the frequency multiplier stage A of FIG. 4 comprises a transistor T*r*11 having a collector load resistor R*v*1 and an additional RF choke D*r*11. The transistor buffer stage of the frequency multiplier stage B of FIG. 4 comprises a transistor T*r*12, a collector load resistor R*v*2 and an additional RF choke D*r*12. The bias for cutting off the frequency multiplier stages is applied to the emitter electrodes of the transistor buffer stages in FIG. 4. The base electrode of the transistor of each of the transistor buffer stages in the embodiment of FIG. 4 is connected to a point at ground or zero potential via a corresponding resistor Rb1 or R*b*2. If ground potential is applied to the circuit points *a* and *b*, the corresponding transistor buffer stage is cut off and constitutes a very high resistance compared to the resistance of the corresponding load resistor R*a*1 or R*a*2. The cutoff transistor buffer stage may therefore operate under the optimum conditions with regard to its load resistor R*a*1 or R*a*2.

The frequency multiplier stage B is assumed to be cut off. In this condition, the decoupling transistor is, on the other hand, switched to its conductive condition by the bias, and therefore supplies the desired forward current to the multiplier diode D2. The forward current in the conducting direction detunes the multiplier diode circuit and also considerably attenuates the frequency multiplier stages which are cut off at that time. The embodiment of FIG. 4 thus provides even greater decoupling than does the embodiment of FIG. 2.

FIG. 5 discloses a circuit for providing even further suppression of the spurious waves. In FIG. 5, a series resonant circuit is connected to the anode of each of the switching diodes. In order to maintain the clarity of illustration, a representative switching diode is indicated as SD in FIG. 5. The series resonant circuit comprises an inductor LS and a variable capacitor CS connected in series circuit arrangement to the anode of the switching diode SD. The series resonant circuit LS, CS is tuned to the harmonic desired to be produced by the illustrative frequency multiplier stage of FIG. 5. The harmonic is thereby suppressed at the input or cathode of the switching diode SD, so that undesired spurious waves generated from the fundamental frequency bus SG by the operative frequency multiplier stage are additionally attenuated. Furthermore, the harmonic intentionally generated in the frequency multiplier stage is suppressed at the input, so that the embodiment of FIG. 5 functions as a harmonic trap and provides double suppression or attenuation.

While the invention has been described by means of specific examples and in specific embodiments, I do not wish to be limited thereto, for obvious modifications will occur to those skilled in the art without departing from the spirit and scope of the invention.

I claim:

1. A circuit arrangement for connecting a plurality of frequency multiplier stages, each producing a different output frequency, and only one of which operates at a specific time, to a common fundamental frequency generator, each of the frequency multiplier stages having an input and an output, said circuit arrangement comprising a plurality of switching diodes each coupling the input of a corresponding one of the frequency multiplier stages to the fundamental frequency generator; a common output terminal; a plurality of bandpass filters each tuned to a different corresponding harmonic and each coupling the output of a corresponding one of the frequency multiplier stages to the common output terminal; and current supply means connected to the switching diodes for supplying current to the fundamental frequency generator via the switching diode of the operating frequency multiplier stage.

2. A circuit arrangement as claimed in claim 1, further comprising voltage cutoff means connected to each of the frequency multiplier states for cutting off all the frequency multiplier stages but the operating one simultaneously with the operation of said one of the frequency multiplier stages.

3. A circuit arrangement as claimed in claim 2, wherein each of the frequency multiplier stages has a step recovery semiconductor multiplier diode and bias means connected to the multiplier diode for shifting the bias of the multiplier diode of each of the frequency multiplier stages to be cut off from a normal operating bias to a high reverse bias.

4. A circuit arrangement as claimed in claim 2, wherein each of the frequency multiplier stages has a step recovering semiconductor multiplier diode and bias means connected to the multiplier diode for biasing the diode of each of the frequency multiplier stages to be cut off in the conductive direction.

5. A circuit arrangement as claimed in claim 3, further comprising cutoff voltage means having a plurality of resistors each connected to a corresponding one of the frequency multiplier stages for applying a cutoff voltage to the corresponding frequency multiplier stage and a plurality of short-circuit means each connected to a corresponding one of the resistors for short-circuiting the resistor of the frequency multiplier stage to be operated.

6. A circuit arrangement as claimed in claim 5, wherein each of the switching diodes is coupled in series between the common fundamental frequency generator and a corresponding one of the frequency multiplier stages so that the cutoff voltage applied to each of the frequency multiplier stages to be cut off by the cutoff voltage means simultaneously blocks the corresponding switching diode.

7. A circuit arrangement as claimed in claim 6, wherein the cutoff voltage means comprises a plurality of common resistors each connected to a corresponding one of the switching diodes for applying the cutoff voltage to the frequency multiplier stages, a plurality of RF chokes each connected between a corresponding one of the common resistors and a corresponding one of the switching diodes for applying the cutoff voltage to the switching diodes, and a plurality of load resistors each coupled between a corresponding one of the common resistors and the multiplier diode of a corresponding one of the frequency multiplier stages for codetermining the bias applied to each of the multiplier diodes, the voltage at a common point in the connection between the common resistor and the load resistor of a frequency multiplier stage to be operated being short-circuited.

8. A circuit arrangement as claimed in claim 6, wherein the cutoff voltage means comprises a plurality of common resistors each for applying the cutoff voltage to a corresponding one of the frequency multiplier stages, a plurality of RF chokes each connected to a corresponding one of the switching diodes for applying the cutoff voltage to the switching diodes, a plurality of transistor buffer stages each connected between a corresponding one of the RF chokes and a corresponding one of the common resistors, and a plurality of separate load resistors each coupled to the multiplier diode of a corresponding one of the frequency multiplier stages for codetermining the bias applied to each of the multiplier diodes and each connected in DC shunt with a corresponding one of the transistor buffer stages, each of the transistor buffer stages having an emitter side connected to the corresponding common resistor and presenting a high resistance circuit relative to the load resistor when the corresponding frequency multiplier stage is cut off and supplying a conduction current of sufficient magnitude for the multiplier diode when the corresponding frequency multiplier stage is operated.

9. A circuit arrangement as claimed in claim 6, further comprising a plurality of harmonic traps each connected to a corresponding one of the switching diodes, each of the harmonic traps being for the harmonic to which the corresponding frequency multiplier stage is tuned.

* * * * *